(12) United States Patent
Ho et al.

(10) Patent No.: US 12,172,886 B2
(45) Date of Patent: Dec. 24, 2024

(54) MICRO-ELECTRO-MECHANICAL SYSTEM (MEMS) VIBRATION SENSOR AND FABRICATING METHOD THEREOF

(71) Applicant: UPBEAT TECHNOLOGY Co., Ltd, New Taipei (TW)

(72) Inventors: Hsien-Lung Ho, New Taipei (TW); Hsi-Wen Tung, New Taipei (TW)

(73) Assignee: UPBEAT TECHNOLOGY CO., LTD, New Taipei (TW)

( * ) Notice: Subject to any disclaimer, the term of this patent is extended or adjusted under 35 U.S.C. 154(b) by 388 days.

(21) Appl. No.: 17/747,856

(22) Filed: May 18, 2022

(65) Prior Publication Data

US 2022/0371881 A1 Nov. 24, 2022

Related U.S. Application Data

(60) Provisional application No. 63/189,749, filed on May 18, 2021.

(51) Int. Cl.
*B81B 3/00* (2006.01)
*B81B 7/02* (2006.01)
*B81C 1/00* (2006.01)

(52) U.S. Cl.
CPC ............. *B81B 3/0021* (2013.01); *B81B 7/02* (2013.01); *B81C 1/00373* (2013.01); *B81B 2201/0257* (2013.01); *B81B 2203/04* (2013.01); *B81C 2201/013* (2013.01); *B81C 2201/0156* (2013.01)

(58) Field of Classification Search
None
See application file for complete search history.

(56) References Cited

U.S. PATENT DOCUMENTS 9,661,411 B1 5/2017 Han et al.

FOREIGN PATENT DOCUMENTS

| CN | 111491244 A | 8/2020 |
|----|-------------|--------|
| CN | 110574397 B | 4/2021 |
| WO | 2021000163 A1 | 1/2021 |

*Primary Examiner* — Anthony Ho
(74) *Attorney, Agent, or Firm* — Innovation Counsel LLP

(57) ABSTRACT

A MEM vibration sensor includes a substrate including a first supporting-portion and a cavity and a sensing-device disposed on the substrate. The sensing-device includes a second supporting-portion correspondingly disposed over and connected with the first supporting-portion, a first sensing-unit disposed on the cavity, a first mass-block disposed on the cavity, a second sensing-unit disposed on the first sensing-unit and the first mass-block, a first metal pad disposed on the third supporting-portion and electrically coupled with the first sensing-unit, and a second metal pad disposed on the third supporting-portion and electrically coupled with the second sensing-unit.

14 Claims, 15 Drawing Sheets

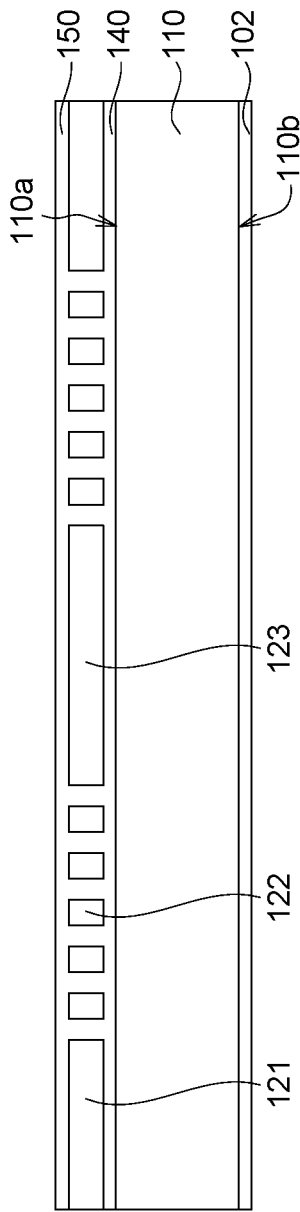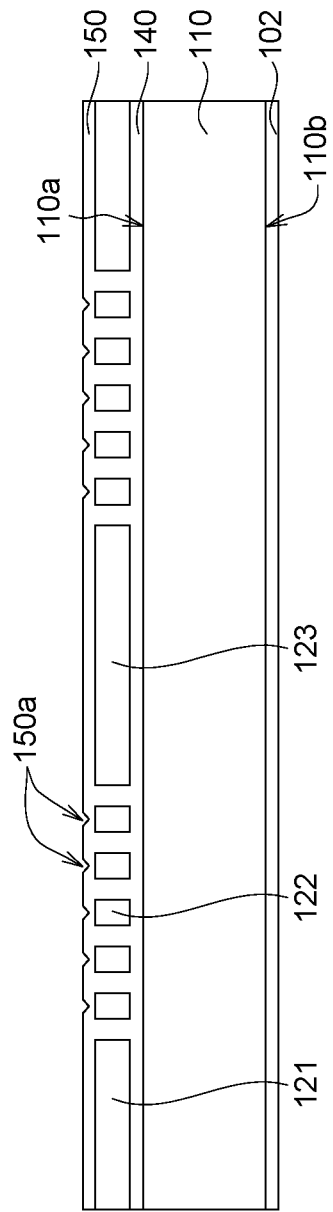

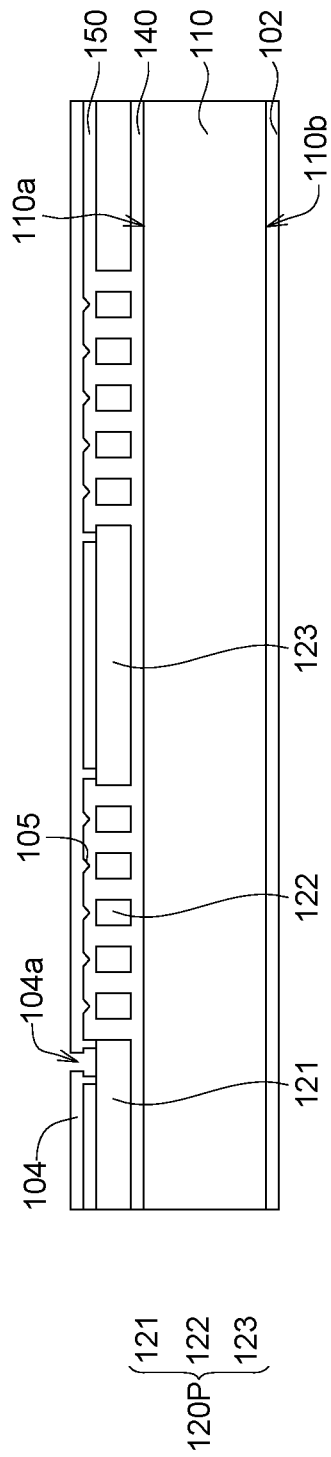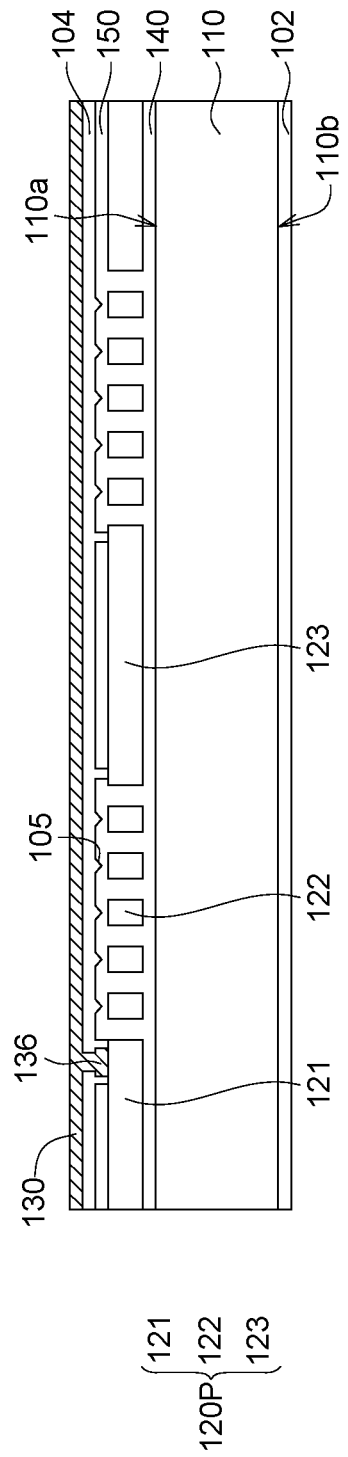

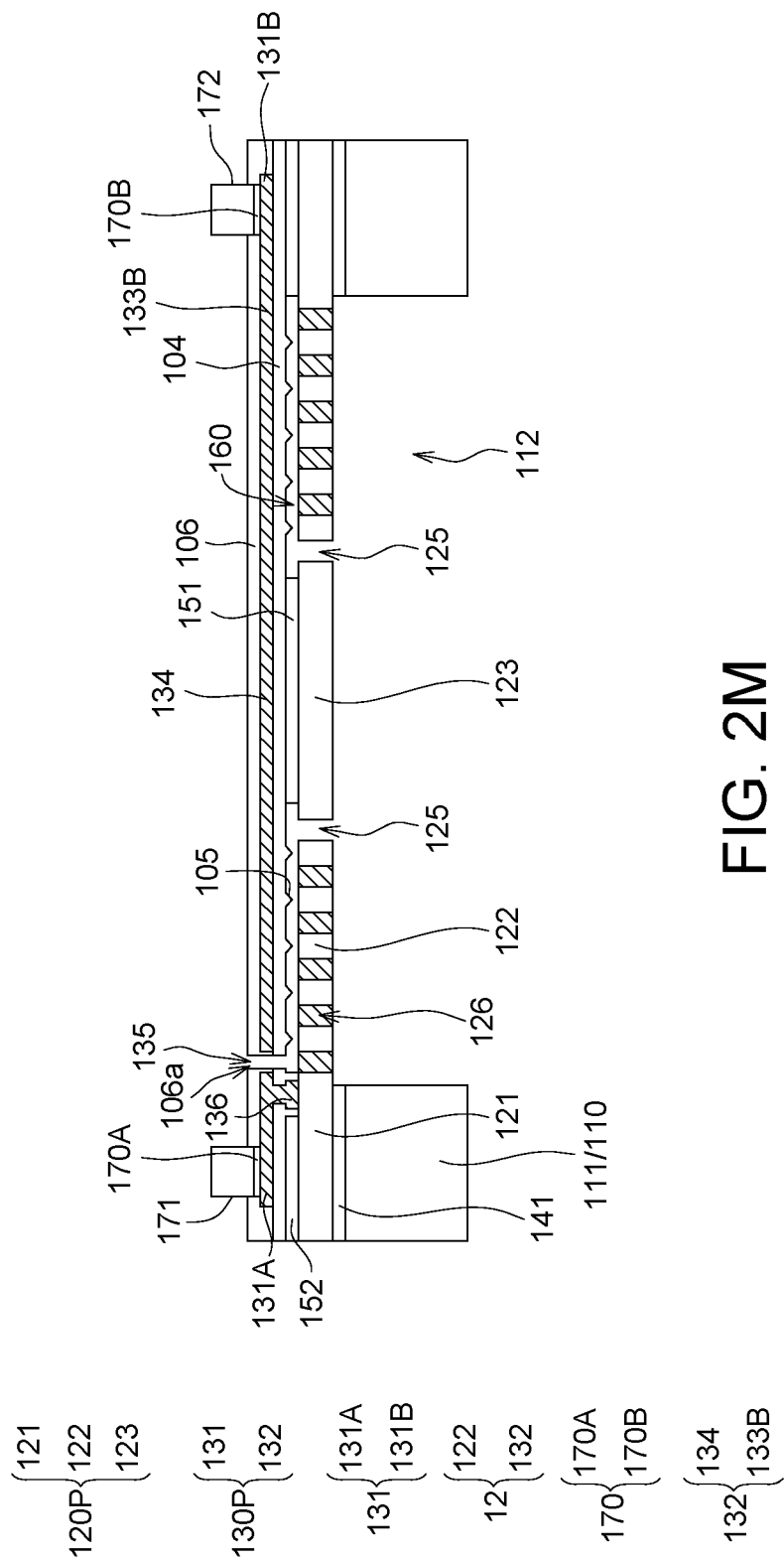

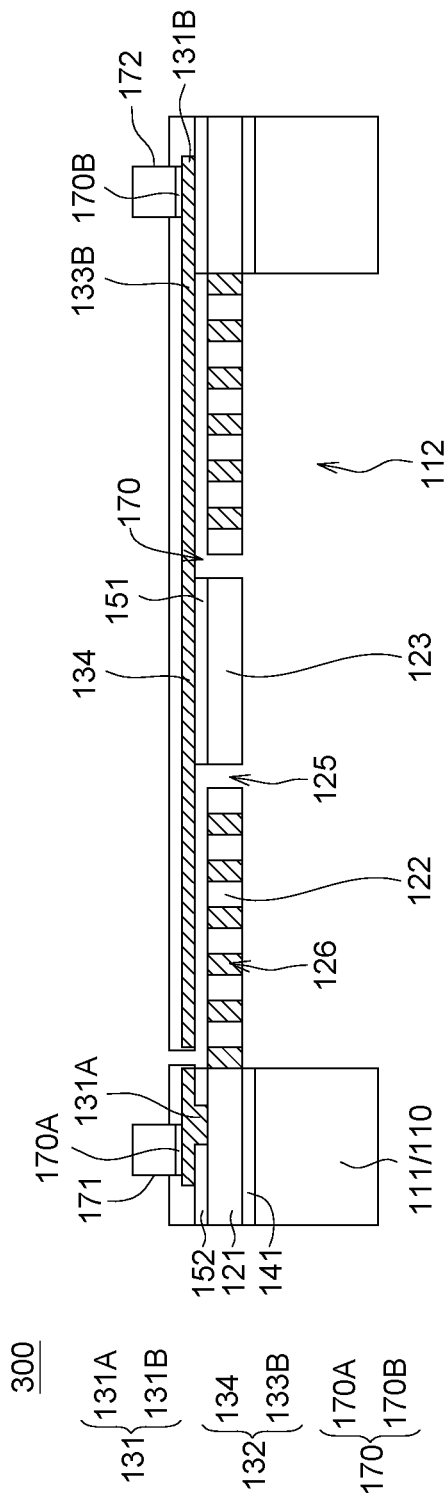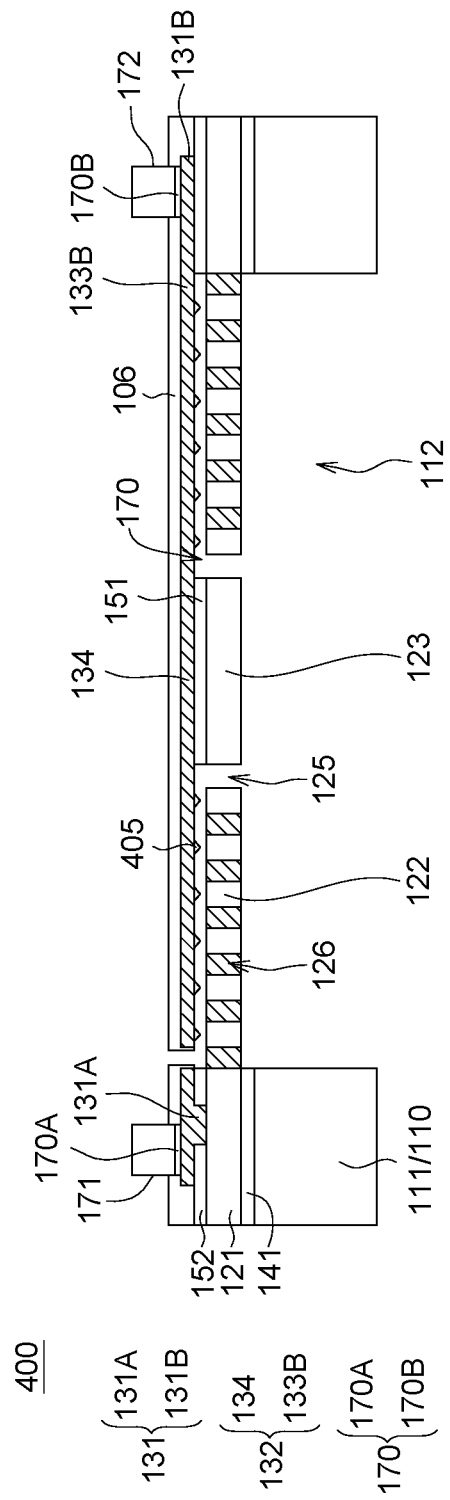

MICRO-ELECTRO-MECHANICAL SYSTEM (MEMS) VIBRATION SENSOR AND FABRICATING METHOD THEREOF

This application claims the benefit of U.S. provisional application Ser. No. 63/189,749, filed May 18, 2021, the subject matter of which is incorporated herein by reference.

BACKGROUND OF THE DISCLOSURE

Field of the Disclosure

The disclosure relates in general to a micro-electromechanical system (MEMS) and the fabricating method thereof, and more particularly to a MEMS bone-conduction microphone and the fabricating method thereof.

Description of the Related Art

Voice communication systems (VCS) and speech recognition technology typically use acoustic microphones to pick up the sound waves generated by the user's speech. Currently, a MEMS vibration sensor (used to detect the vibration of the bones and tissues in the ear canal) is provided on the basis of a traditional MEMS microphone (used to detect the weaker airborne sound of higher speech frequency) to convert the sound waves into mechanical vibrations of different frequencies. Wherein, the MEMS vibration sensor can be mounted on the inner wall of the shell of the earphone by suitable adhesive or glue.

However, this MEMS vibration sensor has problems of occupying a large space, which is not conducive to product miniaturization, and poor sensitivity.

SUMMARY OF THE DISCLOSURE

Therefore, there is a need to provide a MEMS bone-conduction microphone and the fabricating method thereof to overcome the drawbacks of the prior art.

One embodiment of the present disclosure is to provide a MEMS vibration sensor, wherein the MEM vibration sensor includes a substrate and a sensing-device. The substrate includes a first supporting-portion and a cavity. The sensing-device is disposed on the substrate and includes a second supporting-portion, a first sensing-unit, a first mass-block, a second sensing-unit, a third supporting-portion, a first metal pad and a second metal pad. The second supporting-portion is correspondingly disposed over and connected with the first supporting-portion via a first dielectric material. The first sensing-unit is disposed on the cavity. The first mass-block is disposed on the cavity. The second sensing-unit is disposed on the first sensing-unit and the first mass-block, wherein the second sensing-unit connects to the first mass-block via a second dielectric material; and there is a gap between the second sensing-unit and the first sensing-unit. The second sensing-unit further includes a third supporting-portion correspondingly disposed over and connected to the second supporting-portion via a third dielectric material. The first metal pad is disposed on the third supporting-portion and is electrically coupled with the first sensing-unit. The second metal pad is disposed on the third supporting-portion and is electrically coupled with the second sensing-unit.

Another embodiment of the present disclosure is to provide a fabricating method of a MEMS vibration sensor, wherein the method includes steps as follows: A device substrate including a base layer, a first dielectric layer, and a first device material layer is provided. A first patterning process is performed to pattern the first device material layer and form a plurality of through holes therein, so as to expose a portion of the first dielectric layer and to define a first mass-block and a first sensing-unit that are isolated from each other. A second dielectric layer is formed over the first device material layer. A second patterning process is performed to pattern the second dielectric layer, so as to expose a portion of the first device material layer. A first protection layer is formed on the second dielectric layer and the first device material layer. A third patterning process is performed to pattern the first protection layer, so as to expose a portion of the first device material layer. A second device material layer is formed over the first protection layer and the first device material layer. A fourth patterning process is performed to pattern the second device material layer, so as to expose a portion of the first protection layer and to define a second sensing-unit corresponding to both the first mass-block and the first sensing-unit. A first metal pad and a second metal pad are formed on the second device material layer, wherein the first metal pad is electrically coupled to the patterned first device material layer, and the second metal pad is electrically coupled to the patterned second device material layer. A releasing process is performed to remove a portion of the base layer for forming a cavity both corresponding to the first mass-block and the first sensing-unit, and to remove a portion of the first dielectric layer and a portion of the second dielectric layer for forming a gap between the first sensing-unit and the second sensing-unit.

Yet another embodiment of the present disclosure is to provide a fabricating method of a MEMS vibration sensor, wherein the method includes steps as follows: A device substrate including a base layer, a first dielectric layer, and a first device material layer is provided. A first patterning process is performed to pattern the first device material layer and form a plurality of through holes therein, so as to expose a portion of the first dielectric layer and to define a first mass-block and a first sensing-unit that are isolated from each other. A second dielectric layer is formed over the first device material layer. A second patterning process is performed to pattern the second dielectric layer, so as to expose a portion of the first device material layer. A second device material layer is formed on the second dielectric layer. A fourth patterning process is performed to pattern the second device material layer, so as to define a second sensing-unit corresponding to both the first mass-block and the first sensing-unit. A first metal pad and a second metal pad are formed on the second device material layer, wherein the first metal pad is electrically coupled to the patterned first device material layer, and the second metal pad is electrically coupled to the patterned second device material layer. A releasing process is performed to remove a portion of the base layer for forming a cavity both corresponding to the first mass-block and the first sensing-unit, and to remove a portion of the first dielectric layer and a portion of the second dielectric layer for forming a gap between the first sensing-unit and the second sensing-unit.

The above and other aspects of the disclosure will become better understood with regard to the following detailed description of the preferred but non-limiting embodiment(s). The following description is made with reference to the accompanying drawings:

BRIEF DESCRIPTION OF THE DRAWINGS

FIGS. 2A to 2M are series cross-sectional views illustrating the processing structures for fabricating the MEMS vibration sensor as depicted in FIGS. 1A to 1C.

FIG. 3 is a cross-sectional view illustrating the structure of a MEMS vibration sensor according to another embodiment of the present disclosure.

FIG. 4 is a cross-sectional view illustrating the structure of a MEMS vibration sensor according to yet another embodiment of the present disclosure.

DETAILED DESCRIPTION OF THE DISCLOSURE

Figure 1A:
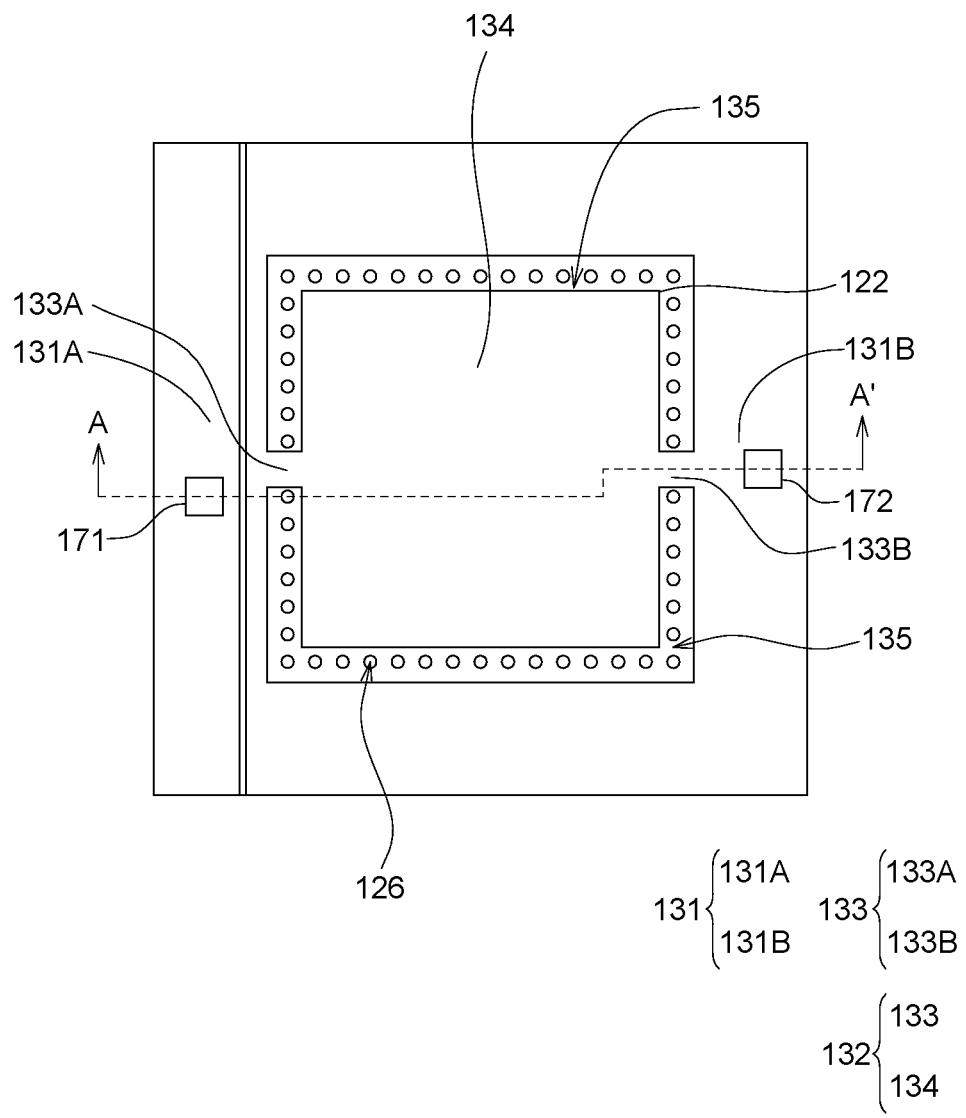
FIG. 1A is a top view illustrating the structure of a MEMS vibration sensor according to one embodiment of the present disclosure.
Figure 1B:
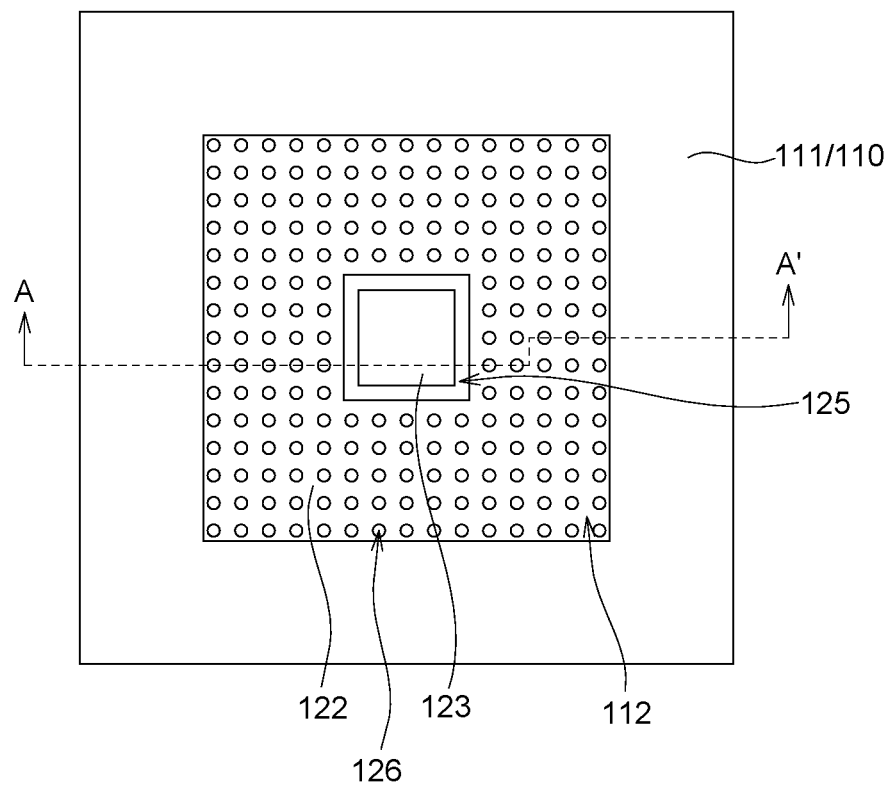
FIG. 1B is a bottom view of the structure of the MEMS vibration sensor as depicted in FIG. 1A.
Figure 1C:
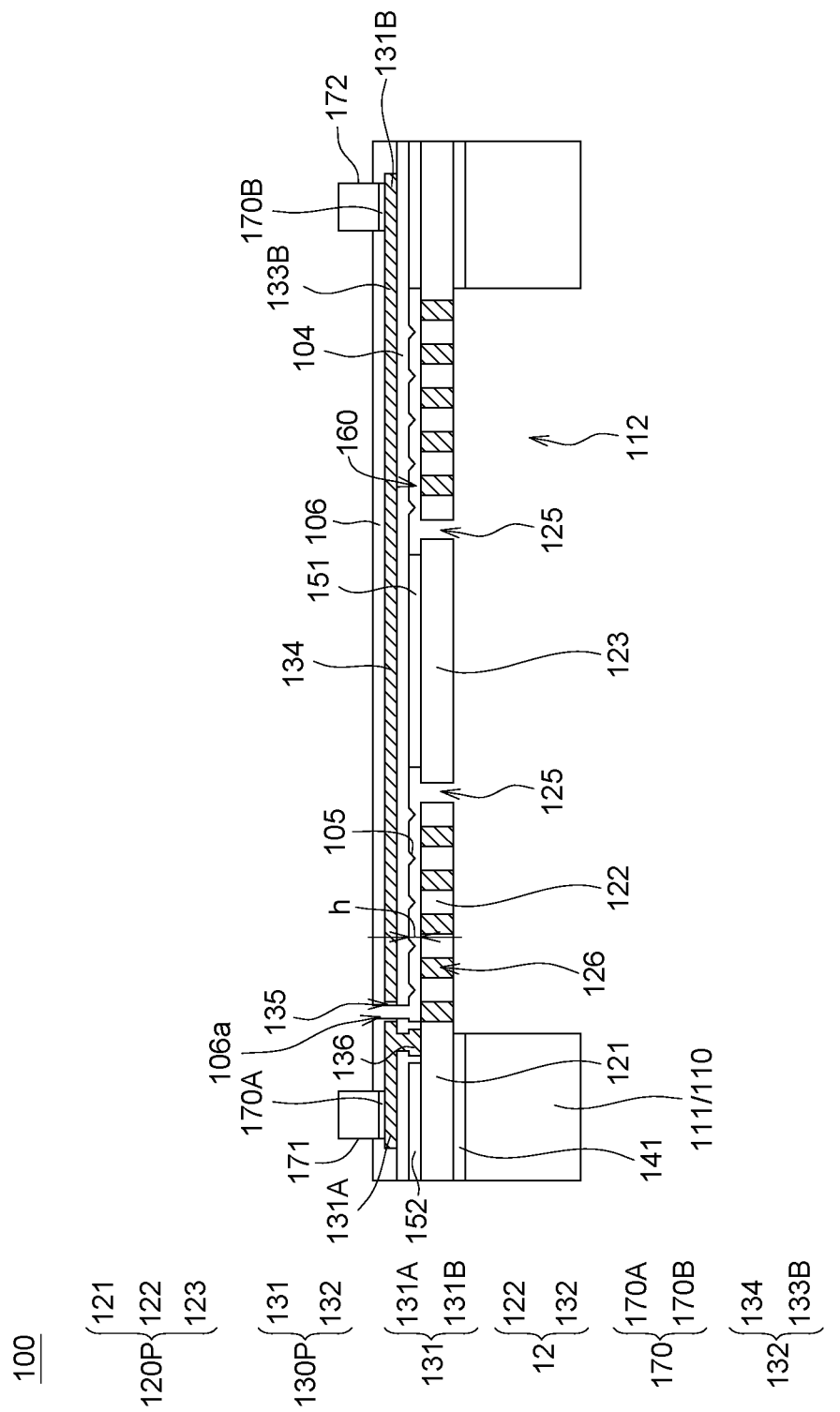
FIG. 1C is a cross-sectional view illustrating the structure of the MEMS vibration sensor taking along the cutting line 1A-1A' as depicted in FIG. 1A.

FIG. 1A is a top view illustrating the structure of a MEMS vibration sensor 100 according to one embodiment of the present disclosure. FIG. 1B is a bottom view of the structure of the MEMS vibration sensor 100 as depicted in FIG. 1A. FIG. 1C is a cross-sectional view illustrating the structure of the MEMS vibration sensor 100 taking along the cutting line 1A-1A' as depicted in FIG. 1A.

The MEMS vibration sensor 100 can be applied in, for example, a vibration detector, a microphone, a sound-receiving apparatus, and the like. The MEMS vibration sensor 100 and the MEMS package structure applying the same can be utilized in headphones, automobiles, wheels, home appliances, industrial instruments and other items that are subjected to vibration analysis according to the received vibration (eg, audio vibration).

The MEMS vibration sensor 100 includes a base layer 110 and a sensing device 12. The base layer 110 includes a first supporting-portion 111 and a cavity 112. The sensing device 12 includes a second supporting-portion 121, a first sensing-unit 122, a first mass-block 123, a second sensing-unit 132, a first metal pad 171 and a second metal pad 172. The second supporting-portion 121 is disposed on the first supporting-portion 111 and is connected to the first supporting-portion 111 via a first dielectric material 141.

The first sensing-unit 122 is disposed on the cavity 112 and is connected with the second supporting-portion 121. The first mass-block 123 is disposed above the cavity 112. The second sensing-unit 132 is disposed on the first sensing-unit 122 and is connected to the first mass-block 123 via the second dielectric material 151, and there is a gap 160 between the second sensing-unit 132 and the first sensing-unit 122. The second sensing-unit 132 further includes a third supporting-portion 131 disposed on the second supporting-portion 121 and connected to the second supporting-portion 121 via a third dielectric material 152. The first metal pad 171 is disposed on the third supporting-portion 131 and is electrically coupled to the first sensing-unit 122. The second metal pad 172 is disposed on the third supporting-portion 131, is electrically isolated from the first metal pad 171, and is electrically coupled to the second sensing-unit 132.

There is an opening 125 disposed between the first mass-block 123 and the first sensing-unit 122; and the opening 125 surrounds the first mass-block 123, so as to make the first mass-block 123 and the first sensing-unit 122 being independent of each other. The third supporting-portion 131 includes a first portion 131A and a second portion 131B that are electrically isolated from each other. The first metal pad 171 is formed on the first portion 131A, and the second metal pad 172 is formed on the second portion. 131B.

In this way, the first mass-block 123 can sense and amplify the amplitude of the external vibration source V1, and drive the second sensing-unit 132 to vibrate up and down relative to the first sensing-unit 122, thereby changing the gap distance h between 122 the second sensing-unit 132 and the first sensing-unit and altering the capacitance value between the second sensing-unit 132 and the first sensing-unit 122; then the signals generated by the altered capacitance value can be transmitted outward by the first metal pad 171 and the second metal pad 17 to a processor (not shown) for processing, calculation and/or analysis, and corresponding actions are performed accordingly. Wherein, the vibration source V1 can be transmitted to the second sensing-unit 132 through solid or air. In the present embodiment, the vibration source V1 can be transmitted through the first supporting-portion 111 including the base layer 110, the first dielectric material 141, the second supporting-portion 121, the third dielectric material 152 and the third supporting-portion 131 to the second sensing-unit 132 (called solid-conduction).

In detail, the base layer 110 may be, for example, a silicon substrate, a silicon wafer or a layer made of other suitable semiconductor materials, but the embodiments of the present disclosure are not limited thereto. The cavity 112 is a through hole formed in the base layer 110, passing through the upper surface 110a and the lower surface 110b of the base layer 110, and is defined by the vertical wall(s) of the first supporting-portion 111. In other words, the sidewall(s) of the cavity 112 is the vertical wall(s) of the first supporting-portion 111.

The second supporting-portion 121, the first sensing-unit 122 and the first mass-block 123 are made of a conductive material. The conductive material described herein may, for example, includes a semiconductor material (e.g., polysilicon, silicon carbide (SiC), single crystal, or other semiconductor materials with conductive properties caused by ion implantation or doping), metal (e.g., copper), alloy material, or other suitable conductive material, or any of the arbitrary combinations thereof. For example, in some embodiments of the present disclosure, the second supporting-portion 121, the first sensing-unit 122 and the first mass-block 123 are included in a patterned first device material layer 120P; and the patterned first device material layer 120P may include polysilicon.

In the present embodiment, the first sensing-unit 122 may be an extending area extending from the second supporting-portion 121 toward the center of the cavity 112. In addition to the opening 125 surrounding the first mass-block 123, the first sensing-unit 122 further includes a plurality of through holes 126.

The second sensing-unit 132 includes a third supporting-portion 131, an elastic connecting portion 133 and a vibrating portion 134. The elastic connecting portion 133 connects the third supporting-portion 131 and the vibrating portion 134. The vibrating portion 134 can be connected with the first mass-block 123 through the second dielectric material 151 under it. In some embodiments of the present disclosure, the third supporting-portion 131, the elastic connecting portion 133 and the vibrating portion 134 of the second sensing-unit 132 are included in a patterned second device material layer 130P. The patterned second device material layer 130P is composed of a conductive material (including metal and/or semiconductor material).

The vibrating portion 134 is the portion of the patterned second device material layer 130P that is disposed on the cavity 112; and the elastic connecting portion 133 may be a beam structure extending from the third supporting-portion 131 to the center of the cavity 112 (as shown in FIG. 1A), used to connect the third supporting-portion 131 to the vibrating portion 134. In detail, the vibrating portion 134 is the portion of the patterned second device material layer 130P disposed in an overlapping area of the patterned second device material layer 130P and the cavity 112. The elastic connecting portion 133 can be at least one elongated beam structure disposed in the overlapping area, and defined by a plurality of through holes (two U-shaped through holes 135 as depicted in FIG. 1A in top view). In the present embodiment, the elastic connecting portion 133 includes two elongated beam structures 133A and 133B respectively disposed on the left side and right side of the vibrating portion 134. One ends of the elongated beam structures 133A and 133B are respectively connected to the first portion 131A and the second portion 131B of the third supporting-portion 131; the other ends of the elongated beam structures 133A and 133B are respectively connected to the left side and right side of the vibrating portion 134.

However, the geometric structure of the elastic connecting portion 133 is not limited thereto. In addition, the geometric structure of the elastic connecting portion 133 can be adjusted/changed to make the second sensing-unit 132 having proper rigidity (stiffness) to obtain the desired vibration detection characteristics, such as, the sensitivity for different vibration frequencies and/or increased detection bandwidth. Specifically, for example, in another embodiment of the present disclosure (not shown), the elastic connecting portion 133 may only include a single elongated beam structure 133A disposed on the right side of the vibrating portion 134, but not include the elongated beam structure 133B on the left side of the vibrating portion 134. In this way, the rigidity of the elastic connecting portion 133 can be weakened for releasing the stress, so that the vibration can be more easily transmitted through the elastic connecting portion 133.

In another embodiment of the present disclosure, the elastic connecting portion 133 may include four elongated beam structures (not shown) respectively disposed on the four sides of the vibrating portion 134 and connecting the vibrating portion 134 and the third supporting-portion 131. In this way, the rigidity of the elastic connecting portion 133 can be strengthened to prevent the elastic connecting portion 133 from warping. However, it should be apricated that the structure, shape, number and/or size of the elastic connecting portion 133 in the embodiments of the present disclosure do not limit to these regards.

In addition, the elastic connecting portion 133 may further include at least one rigidity adjustment structure, such as a protruding structure (such as at least one rib (not shown) and/or protruding bump (not shown), etc.) for strengthening the rigidity, and/or corrugated or hollow structures (such as blind holes and/or through holes (not shown), etc.) that can weaken rigidity. In the embodiments of the present disclosure the shape, number and/or size of the protruding structure and/or the hollow structure are not limited.

At least one dimple/bump 105 may be further provided between the elastic connecting portion 133 of the second sensing-unit 132 and the first sensing-unit 122 to prevent the elastic connecting portion 133 of the second sensing-unit 132 from being contact and/or sticking to the first sensing-unit 122. A sensing-unit 122 contacts and sticks. In some embodiments of the present disclosure, the material constituting the dimple/bump 105 may be a dielectric material, such as oxide or silicon nitride. In other embodiments of the present disclosure, the material constituting the dimple/bump 105 may be the same as the material constituting the patterned second device material layer 130P.

FIGS. 2A to 2M are series cross-sectional views illustrating the processing structures for fabricating the MEMS vibration sensor 100 as depicted in FIGS. 1A to 1O.

Figure 2A:
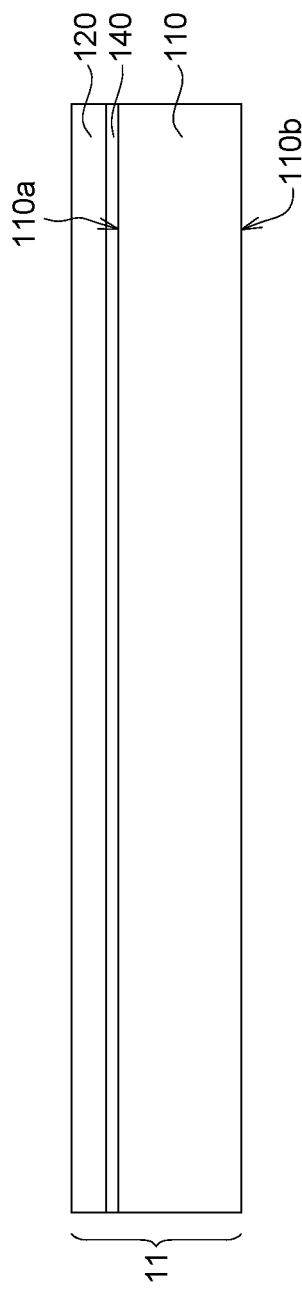

As shown in FIG. 2A, a device substrate 11 is provided, wherein the device substrate 11 includes a dielectric layer 140 and a first device material layer 120 sequentially stacked on an upper surface 110a of a base layer 110. In one embodiment of the present disclosure, the base layer 110 may be, for example, a silicon substrate. However, the embodiment of the present disclosure is not limited thereto, and the base layer 110 may include other suitable semiconductor materials.

The material constituting the dielectric layer 140 may include silicon oxide, silicon nitride and/or other suitable dielectric materials. The step of forming the dielectric layer 140 may include a deposition process (e.g., a plasma enhanced oxide (PEOX) deposition process) or a thermal oxide deposition process. Material constituting the first device material layer 120 may include semiconductor material (e.g., polysilicon), metal (e.g., copper), alloy material, or other suitable conductive material or any of the arbitrary combinations thereof. In another embodiment of the present specification, the step of providing the device substrate 11 may include providing a silicon-on-insulator (SOI) substrate.

Figure 2B:
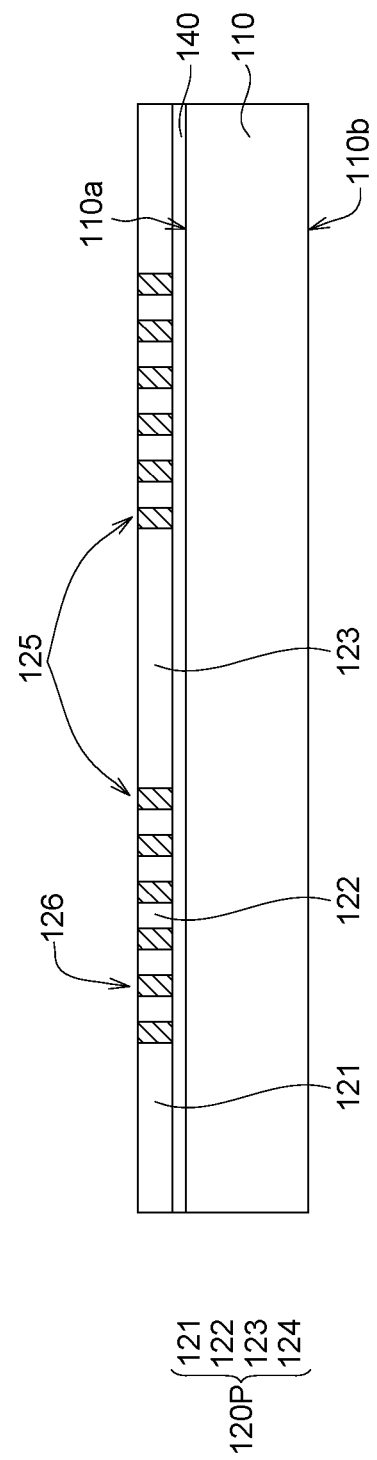

As shown in FIG. 2B, a first patterning step is performed to pattern the first device material layer 120 to form a plurality of through holes (e.g., the openings 125 and the plurality of through holes 126), and to expose a portion of the dielectric layer 140. In the present embodiment, a photolithography etching process, including steps of coating (photoresist), exposure, development and/or etching, is performed to pattern the first device material layer 120, so as to form the openings 125 surrounding the first mass-block 123 and a plurality of through holes 126 in the first device material layer 120 to expose portions of the dielectric layer 140. Wherein, the openings 125 can make the first mass-block 123 and the first sensing-unit 122 being independently from each other, thereby forming a patterned first device material layer 120P having the second supporting-portion 121, the first sensing-unit 122 and the first mass-block 123.

As shown in FIG. 2C, a dielectric layer 150 is provided over the first device material layer 120 (i.e., the patterned first device material layer 120P). In the present embodiment, the method for providing the dielectric layer 150 includes the following steps (but not limited thereto): Firstly, a thermal oxidation process is performed on the base layer 110 and the patterned first device material layer 120P (or performing at least one electrical material deposition process) to form the dielectric layers 102 and 150 on the lower surface 110b of the base layer 110 and the upper surface of the patterned first device material layer 120P, respectively, and to fill the openings 125 and the through holes 126 with the dielectric material. Then, the dielectric layer 150 is planarized by a chemical mechanical polishing (CMP) process. The material constituting the dielectric layers 102 and 150 may preferably include silicon oxide.

Figure 2E:
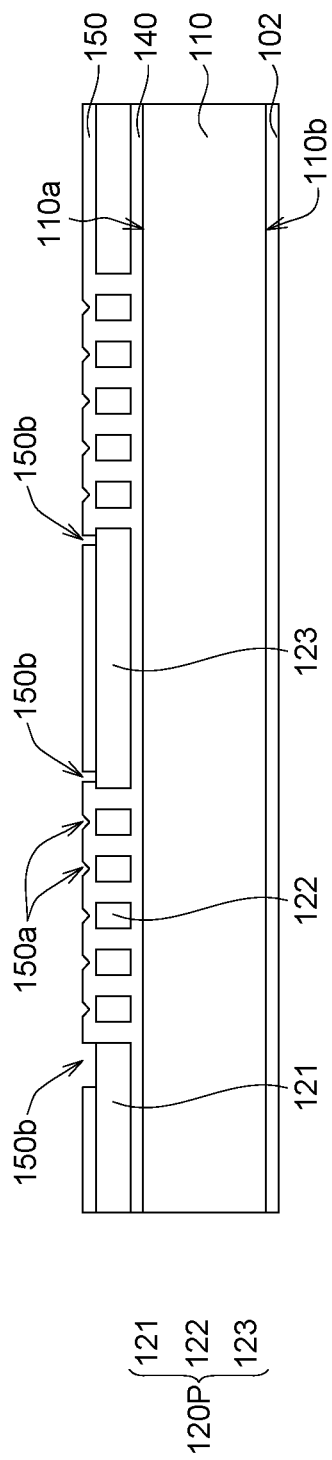

Subsequently, the dielectric layer 150 is patterned to expose a portion of the first device material layer 120 (i.e., the patterned first device material layer 120P). In some embodiments of the present disclosure, the process for patterning the dielectric layer 150 includes steps as follows: Firstly, a lithography etching process is performed to remove a portion of the dielectric layer 150 corresponding to the first sensing-unit 122 to form a plurality of recesses 150a (as shown in FIG. 2D). Another lithography etching process is then performed to remove another portion of the dielectric layer 150 corresponding to the second supporting-portion 121, so as to form a plurality of through holes 150b exposing parts of the second supporting-portion 121 and the first mass-block 123 that are included in the first device material layer 120 (i.e., the patterned first device material layer 120P) (as shown in FIG. 2E).

Figure 2F:
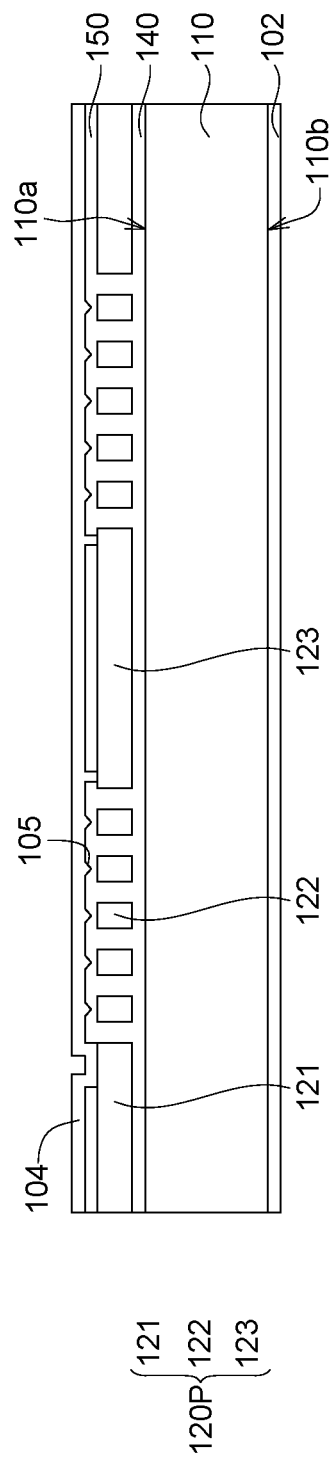

As shown in FIG. 2F, the first protection layer 104 is formed on the exposed portions of the dielectric layer 150 and the first device material layer 120 (i.e., the patterned first device material layer 120P). In some embodiments of the present disclosure, a deposition process may be performed to deposit a dielectric material over the dielectric layer 150 and fill the recesses 150a and the through holes 150b to form the first protection layer 104. In one embodiment, the material constituting the first protection layer 104 is different from the material constituting the dielectric layer 150. In the present embodiment, the material constituting the first protection layer 104 may include silicon nitride or silicon oxynitride (but not limited thereto). The portions of the first protection layer 104 filled in the recesses 150a may form a plurality of dimples/bumps 105.

As shown in FIG. 2G, a third patterning step is performed to pattern the first protection layer 104 and expose a portion of the first device material layer 120 (i.e., the patterned first device material layer 120P). In some embodiments of the present disclosure, a portion of the first protection layer 104 is removed by a lithography etching process to form the through hole 104a and expose a portion of the second supporting-portion 121 included in the first device material layer 120 (i.e., the patterned first device material layer 120P).

As shown in FIG. 2H, the second device material layer 130 is formed on the first protection layer 104 and the exposed portion of the first device material layer 120 (i.e., the patterned first device material layer 120P). In some embodiments of the present disclosure, the forming of the second device material layer 130 includes steps as follows: A deposition process is performed to deposit semiconductor material (e.g., polysilicon, silicon carbide, monocrystalline silicon, or semiconductor materials with conductive properties provided through ion implantation or doping processes), metal (e.g., copper), alloy, or other suitable conductive material) on the first protection layer 104 and fill the through holes 104a, so as to form conductive plugs 136 electrically connecting the second device material layer 130 and the second supporting-portion 121 of the first patterned device material layer 120P.

Figure 2I:
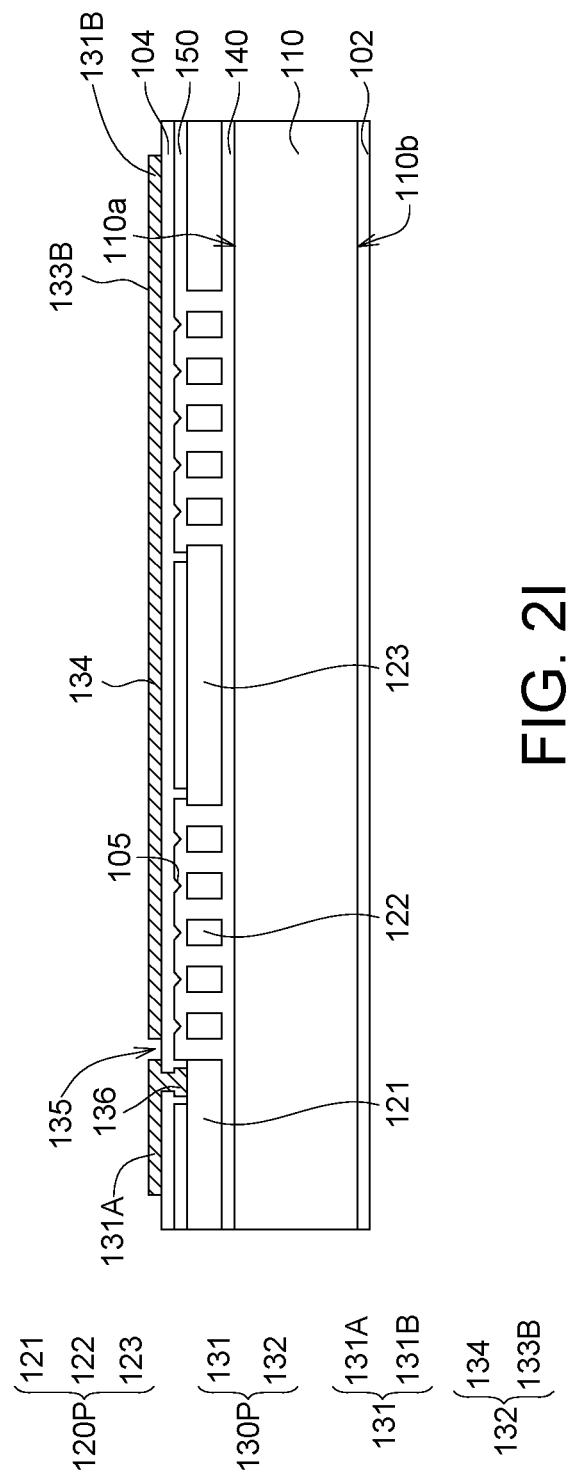

As shown in FIG. 2I, a fourth patterning step is performed to pattern the second device material layer 130 and expose a portion of the first protection layer 104. In some embodiments of the present disclosure, a lithography etching process is performed to remove a portion of the second device material layer 130 to form a plurality of through holes 135 and expose a portion of the first protection layer 104; thereby the patterned second device material layer 130P including the third supporting-portion 131, the elastic connecting portion 133 and the vibrating portion 134 can be formed. The third supporting-portion 131 can be further divided into a first portion 131A and a second portion 131B isolated from each other; and the first portion 131A is electrically connected to the second supporting-portion 121 of the patterned first device material layer 120P through the conductive plug 136.

Figure 2J:
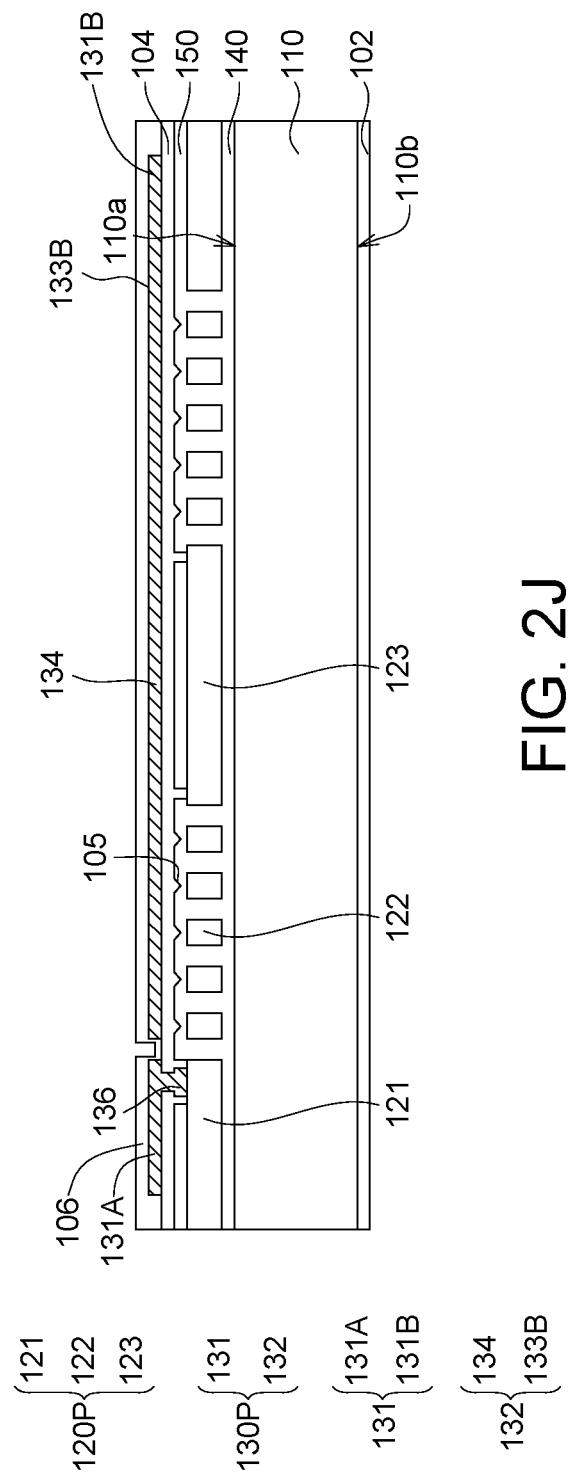

As shown in FIG. 2J, a second protection layer 106 is formed over the second device material layer 130 (i.e., the patterned second device material layer 130P). In some embodiments of the present disclosure, a deposition process can be performed over the second device material layer 130 for depositing dielectric material and filling the through holes 135, so as to form the second protection layer 106. The material constituting the second protection layer 106 may be the same as or different from the material constituting the first protection layer 104. For example, in this embodiment, the material constituting the second protection layer 106 may be silicon nitride or silicon oxynitride (but not limited thereto).

Figure 2K:
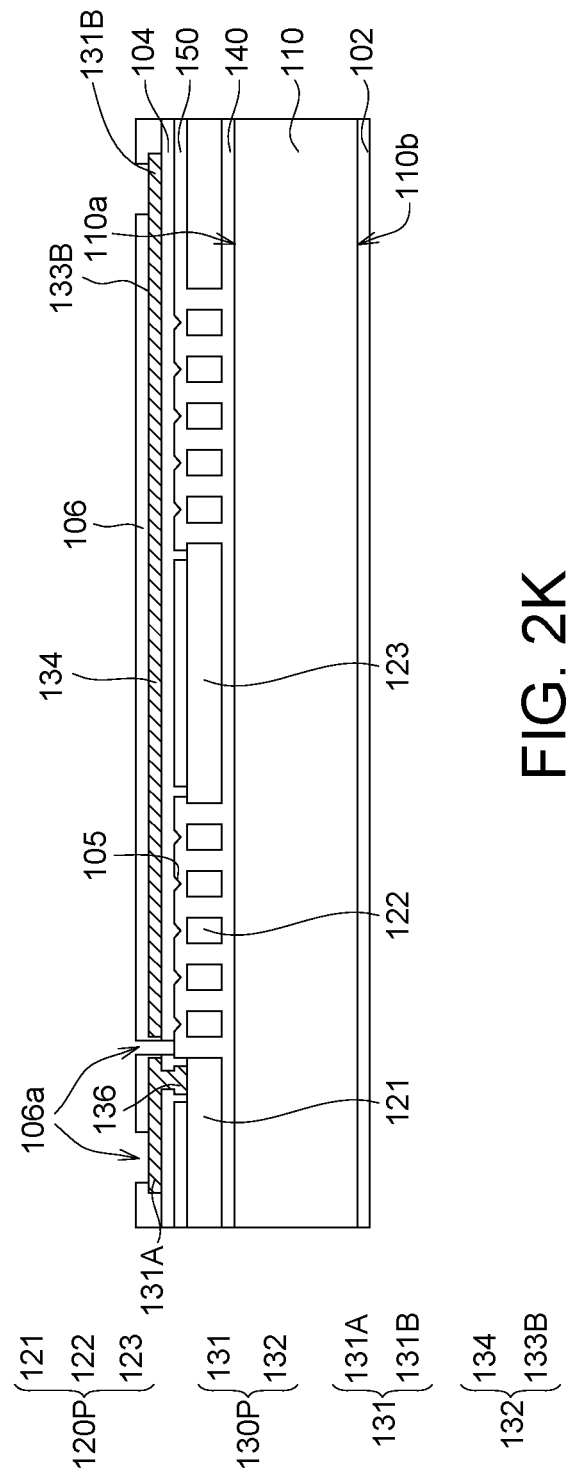

As shown in FIG. 2K, a fifth patterning step is performed to pattern the second protection layer 106, so as to expose a part of the second device material layer 130 (i.e., the patterned second device material layer 130P). In some embodiments of the present disclosure, a lithography etching process is performed to remove a portion of the second protection layer 106, so as to form a plurality of through holes 106a exposing a portion of the third supporting-portion 131 (e.g., the first portion 131A and the second portion 131B) of the second device material layer 130 (i.e., the patterned second device material layer 130P) and a portion of the dielectric layer 150.

Figure 2L:
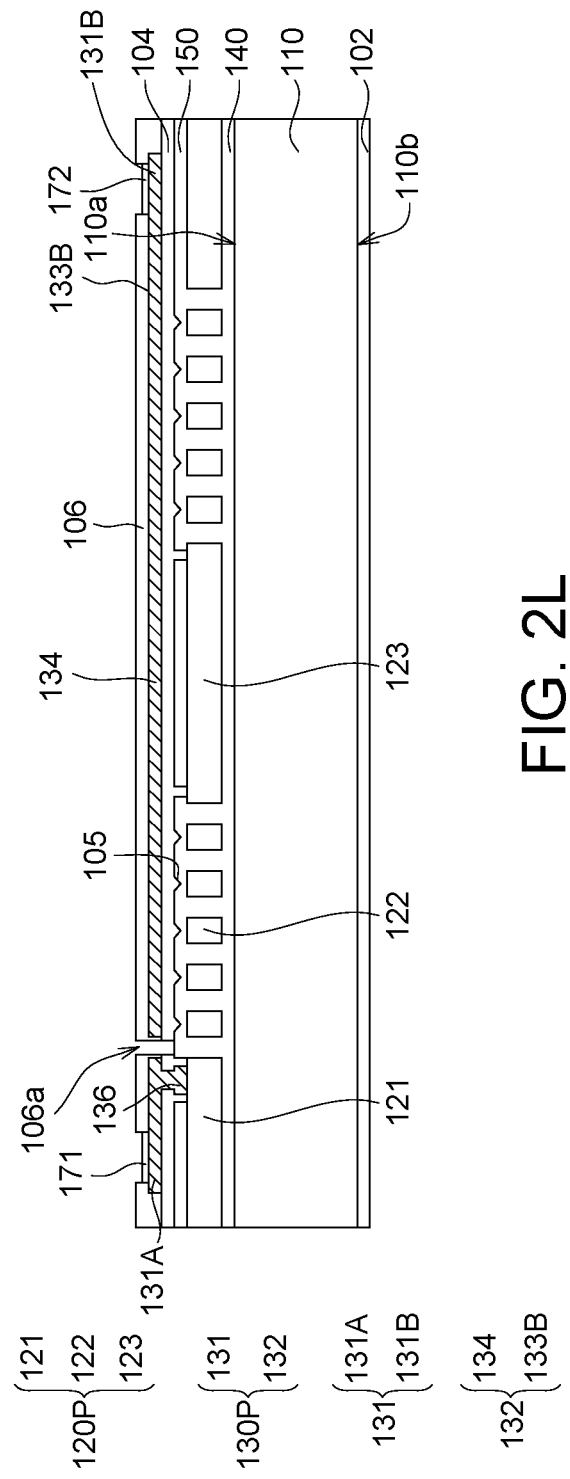

As shown in FIG. 2L, a first metal pad 171 and a second metal pad 172 are formed on the second device material layer 130 (i.e., the patterned second device material layer 130P), so that the first metal pad 171 can be electrically coupled to the first device material layer 120 (i.e., the patterned first device material layer 120P), and the second metal pad 172 can be electrically coupled to the second device material layer 130 (i.e., the patterned second device material layer 130P).

In some embodiments of the present disclosure, the forming of the first metal pads 171 and the second metal pads 172 includes steps as follows: Firstly, an electrode layer 170 is formed over the second protection layer 106 by a metal deposition process to fill the through holes 106a. The electrode layer 170 is then patterned to remove a portion thereof, so as to at least divide the electrode layer 170 into a first partial electrode layer 170A and a second partial electrode layer 170B which are electrically isolated from each other. The first partial electrode layer 170A is electrically coupled to the first portion 131A of the second device material layer 130 (i.e., the patterned second device material layer 130P); the second partial electrode layer 170B is electrically coupled to the second portion 131B of the second device material layer 130 (i.e., the patterned second device material layer 130P). Subsequently, a serious of process, such as a metal deposition, a lithography etching process and/or a photoresist-lift-off process, etc., may be performed to form the first metal pad 171 and the second metal pad 172 that are electrically isolated from each other and are respectively disposed on the first partial electrode layer 170A and the second partial electrode layer 170B.

As shown in FIG. 2M, a releasing process is performed to remove a portion of the base layer 110 for forming the cavity 112, to remove a portion of the dielectric layer 140 and a portion of the dielectric layer 150 for forming a gap 160 between the first device material layer (i.e., the patterned first device material layer 120P) and the second device material layer 130 (i.e., the patterned second device material layer 130P).

In some embodiments of the present disclosure, at least one lithography etching process is firstly performed to remove a portion of the base layer 110, so as to form the cavity 112 penetrating the upper surface 110a of the base layer 110 and the lower surface 110b of the base layer 110. Then at least one wet cleaning (etching) process is performed to remove the portion of the dielectric layer 140 disposed in the through hole 126 via the cavity 112 and the through hole 106a, and to remove the portion of the dielectric layer 150 disposed between the elastic connecting portion and the first sensing-unit 122.

In the present embodiment, the remaining portion of the base layer 110 used to define the cavity 112 can serve as the first supporting-portion 111 of the MEMS vibration sensor 100. The remaining portion of the dielectric layer 140 disposed above the first supporting-portion 111 may serve as the first dielectric material 141 connected to the first supporting-portion 111. The remaining portion of the dielectric layer 150 disposed between the second sensing-unit 132 and the first mass-block 123 can serve as the second dielectric material 151 connecting the second sensing-unit 132 and the first mass-block 123. The remaining portion of the dielectric layer 150 disposed between the second supporting-portion 121 and the third supporting-portion 131 can serve as the third dielectric material 152 connecting the second supporting-portion 121 and the third supporting-portion 131. In other words, the second dielectric material 151 and the third dielectric material 152 are the same material.

After a series of down-stream processes are performed, the preparation of the MEMS vibration sensor 100 can be completed. Since the remaining manufacturing steps of the down-stream processes are the same as or similar to the corresponding manufacturing steps of the conventional MEMS vibration sensor, thus they will not be redundantly repeated here.

FIG. 3 is a cross-sectional view illustrating the structure of a MEMS vibration sensor 300 according to another embodiment of the present disclosure. In the present embodiment, the processing structures for fabricating the MEMS vibration sensor 300 is substantially similar to that for fabricating the MEMS vibration sensor 100 as depicted in FIGS. 1A to 10, the difference there between is that the process steps for forming the MEMS vibration sensor 300 omits the steps for forming the recesses 150a in the dielectric layer 150 (as shown in FIG. 2D) and the steps for forming the first protection layer 104 over the dielectric layer 150 and the first device material layer 120 (as shown in FIG. 2F). Therefore, there are no first protection layer 104 and bumps 105 formed between the second sensing-unit 132 and the first sensing-unit 122 of the MEMS vibration sensor 300. Since the corresponding (remaining) structure, materials and manufacturing steps of the MEMS vibration sensor 300 are the same as or similar to that of the MEMS vibration sensor 100, thus they will not be redundantly repeated here.

FIG. 4 is a cross-sectional view illustrating the structure of a MEMS vibration sensor 400 according to yet another embodiment of the present disclosure. In the present embodiment, the processing structures for fabricating the MEMS vibration sensor 400 is substantially similar to that for fabricating the MEMS vibration sensor 100 as depicted in FIGS. 1A to 10, the difference there between is that the process steps for forming the MEMS vibration sensor 300 omits the steps for forming the first protection layer 104 over the dielectric layer 150 and the first device material layer 120 (as shown in FIG. 2F). Therefore, there are no first protection layer 104 formed between the second sensing-unit 132 and the first sensing-unit 122 of the MEMS vibration sensor 300. And after the second sensing-unit 132 is formed, a plurality of bumps 405 with the same material as the patterned second device material layer 130P will be formed between the second sensing-unit 132 and the first sensing-unit 122. Since the corresponding (remaining) structure, materials and manufacturing steps of the MEMS vibration sensor 400 are the same as or similar to that of the MEMS vibration sensor 100, thus they will not be redundantly repeated here.

Figure 5:
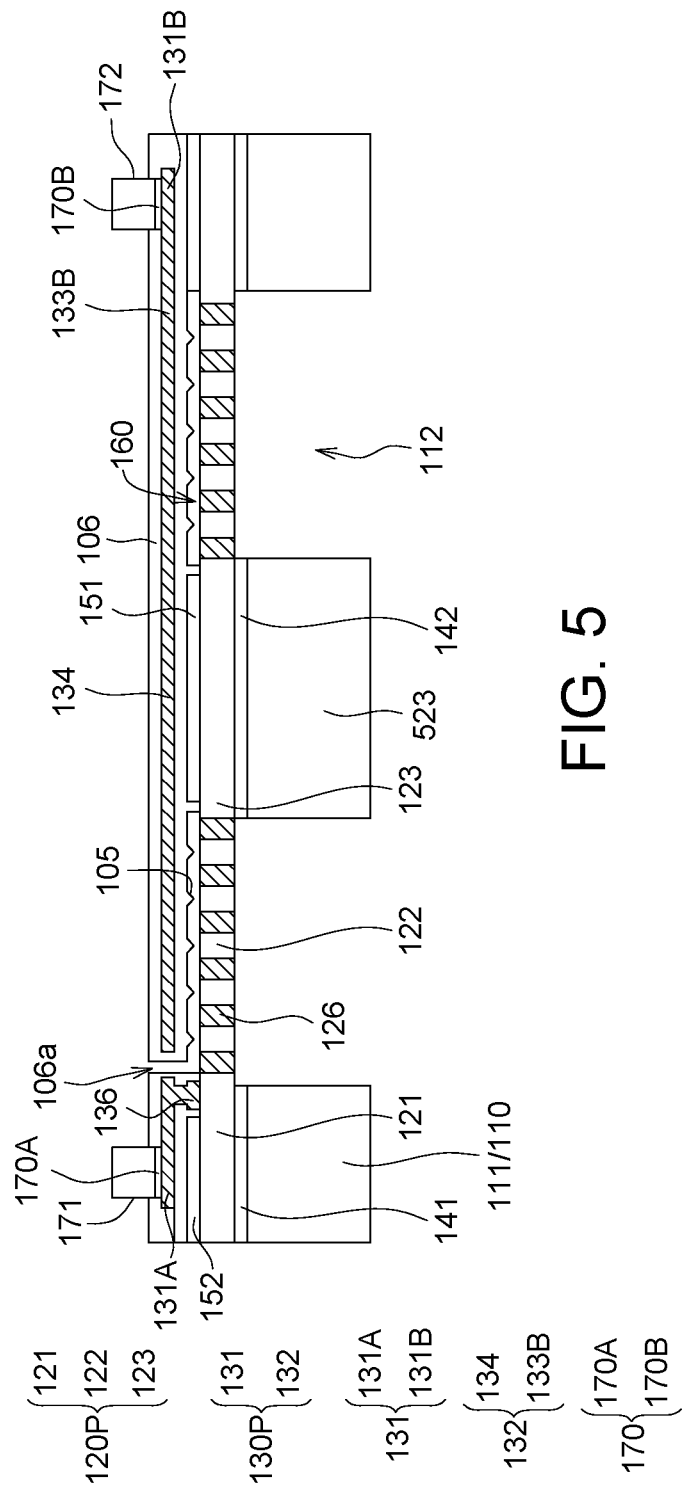
FIG. 5 is a cross-sectional view illustrating the structure of a MEMS vibration sensor according to yet another embodiment of the present disclosure.

FIG. 5 is a cross-sectional view illustrating the structure of a MEMS vibration sensor 500 according to yet another embodiment of the present disclosure. In the present embodiment, the processing structures for fabricating the MEMS vibration sensor 500 is substantially similar to that for fabricating the MEMS vibration sensor 100 as depicted in FIGS. 1A to 10, the difference there between is that the MEMS vibration sensor 500 further includes a second mass-block 113 disposed in the cavity 112 and connected to the first mass-block 123 via a fourth dielectric material 142. The second mass-block 113 can shift within a limited range in the cavity 112 in conjunction with the actions of the second sensing-unit 132 to improve the sensitivity of the MEMS vibration sensor 500.

In the present embodiment, the second mass-block 113 and the fourth dielectric material 142 may be the remaining portions of the base layer 110 and the dielectric layer 140, respectively, that are reserved from the release step (as shown in FIG. 2M). In other words, the second mass-block 113 and the first supporting-portion 111 are made of the same material; the fourth dielectric material 142 and the first dielectric material 141 are made of the same material.

Figure 6:
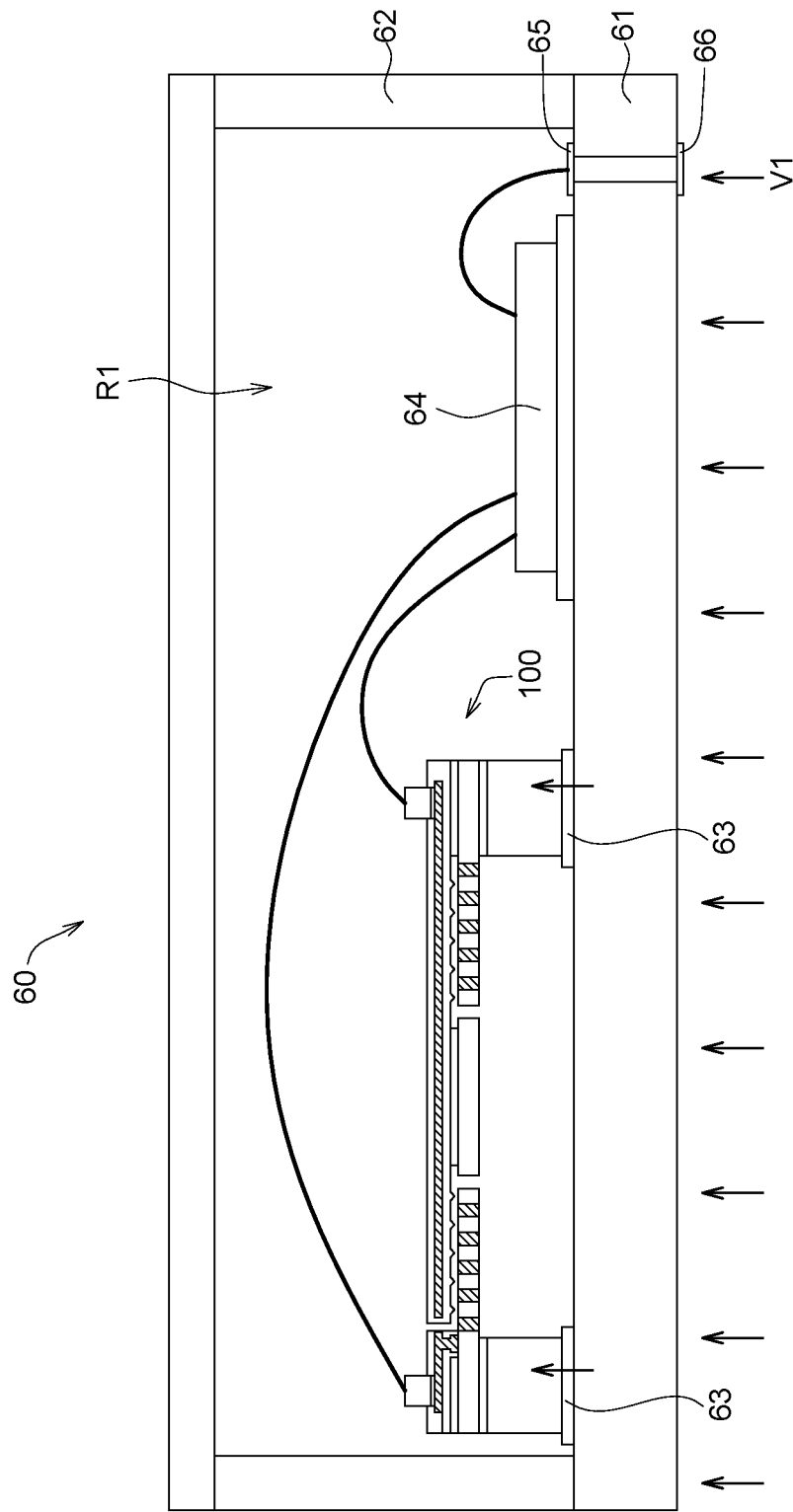
FIG. 6 is a cross-sectional view illustrating a MEMS package structure including a MEMS vibration sensor according to one embodiment of the present disclosure.

FIG. 6 is a cross-sectional view illustrating a MEMS package structure 60 including a MEMS vibration sensor 100 according to one embodiment of the present disclosure. The MEMS package structure 60 may include a MEMS vibration sensor 100, a carrier board 61, a casing 62, load pads 63, an integrated circuit (IC) die 64, at least one first contact 65 and at least one second contact 66. The carrier board 61 and the casing 62 can define an accommodating space R1. The MEMS vibration sensor 100 can be disposed on the load pads 63 of the carrier board 61. The load pads 63 have insulating properties and/or thermal conductivity. The IC die 64 may be disposed on the carrier board 61. The MEMS vibration sensor 100 can be electrically coupled to the IC die 64 and the carrier board 13, respectively, using the connecting wires 67 by a wire bonding process. The carrier board 61 may be a part of a printed circuit board or a printed circuit board itself. In one embodiment of the present disclosure, the IC die 64 is an application specific integrated circuit (ASIC) chip. The sensing signal collected by the MEMS vibration sensor 100, after being transmitted to the IC die 64 through the connecting wire 67 for processing, can be outputted through the first contact 65 and the second contact 66.

In one embodiment of the present disclosure, the carrier board 61 can be disposed close to the direction of the signal source V1, which includes a solid conduction path, such as the ear bone and the like. In another embodiment of the present disclosure, the inner space of the MEMS package structure 60 can be filled with gas (e.g., nitrogen gas) to avoid the metal pads 171/172 and the metal wires from being oxidation, which may affect its electrical properties. In yet another embodiment, the inner space of the MEMS package structure 60 can be evacuated to reduce damping effect, energy loss or mechanical dissipation. In yet another embodiment, the MEMS vibration sensor 100 of the MEMS package structure 60 can be replaced by any one of the MEMS vibration sensors 300, 400 and 500 as discussed above.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A micro-electro-mechanical system (MEMS) vibration sensor, comprising:
    a substrate, comprising a first supporting-portion and a cavity; and
    a sensing-device disposed on the substrate, comprising:
        a second supporting-portion, correspondingly disposed over and connected with the first supporting-portion via a first dielectric material;
        a first sensing-unit, disposed on the cavity and connected to the second supporting-portion;
        a first mass-block, disposed on the cavity;
        a second sensing-unit, disposed on the first sensing-unit and the first mass-block, wherein the second sensing-unit connects to the first mass-block via a second dielectric material; and a gap is forming between the second sensing-unit and the first sensing-unit; wherein the second sensing-unit further comprises a third supporting-portion correspondingly disposed over and connected to the second supporting-portion via a third dielectric material;
        a first metal pad, disposed on the third supporting-portion and electrically coupled with the first sensing-unit; and
        a second metal pad, disposed on the third supporting-portion and electrically coupled with the second sensing-unit.

2. The MEMS vibration sensor according to claim 1, wherein the second supporting-portion, the first sensing-unit and the first mass-block are included in a patterned first device material layer; and the third supporting-portion and the second sensing-unit are included in a patterned second device material layer.

3. The MEMS vibration sensor according to claim 2, wherein the patterned first device material layer comprises metal and a semiconductor material.

4. The MEMS vibration sensor according to claim 2, wherein the patterned second device material layer comprises metal and a semiconductor material.

5. The MEMS vibration sensor according to claim 1, wherein the first sensing-unit further comprises a plurality of through holes.

6. The MEMS vibration sensor according to claim 1, wherein an opening is formed between the first mass-block and the first sensing-unit and surrounds the first mass-block, so as to make the first mass-block and the first sensing-unit being independent of each other.

7. The MEMS vibration sensor according to claim 1, wherein the third supporting-portion further comprises a first portion and a second portion electrically isolated from each other; the first metal pad is formed on the first portion; and the second metal pad is formed on the second portion.

8. The MEMS vibration sensor according to claim 1, further comprising a second mass-block disposed in the cavity and connected to the first mass-block via a fourth dielectric material.

9. The MEMS vibration sensor according to claim 8, wherein the second mass-block shifts within a limited range in the cavity in conjunction with actions of the second sensing-unit.

10. The MEMS vibration sensor according to claim 8, wherein the second mass-block and the first supporting-portion are made of the same material; the fourth dielectric material and the first dielectric material are made of the same material.

11. The MEMS vibration sensor according to claim 1, wherein the second dielectric material and the third dielectric material are made of the same material.

12. The MEMS vibration sensor according to claim 1, further comprising a plurality of dimples/bumps disposed between the second sensing-unit and the first sensing-unit.

13. The MEMS vibration sensor according to claim 1, wherein the plurality of dimples/bumps are connected to the second sensing-unit.

14. The MEMS vibration sensor according to claim 1, further comprising a protection layer formed on a first surface of the second sensing-unit facing the first sensing-unit or on a second surface of the second sensing-unit away from the first sensing-unit, wherein the protection layer comprises a plurality of dimples/bumps disposed between the second sensing-unit and the first sensing-unit.

* * * * *